US011527569B2

(12) United States Patent
Mao et al.

(10) Patent No.: US 11,527,569 B2
(45) Date of Patent: Dec. 13, 2022

(54) HIGH DYNAMIC RANGE SPLIT PIXEL CMOS IMAGE SENSOR WITH LOW COLOR CROSSTALK

(71) Applicant: OMNIVISION TECHNOLOGIES, INC., Santa Clara, CA (US)

(72) Inventors: Duli Mao, Sunnyvale, CA (US); Bill Phan, San Jose, CA (US); Keiji Mabuchi, Los Altos, CA (US); Seong Yeol Mun, Santa Clara, CA (US); Yuanliang Liu, San Jose, CA (US); Vincent Venezia, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 408 days.

(21) Appl. No.: 16/877,077

(22) Filed: May 18, 2020

(65) Prior Publication Data
US 2021/0358993 A1   Nov. 18, 2021

(51) Int. Cl.
*H01L 27/146* (2006.01)
*H04N 5/378* (2011.01)

(52) U.S. Cl.
CPC .... *H01L 27/14645* (2013.01); *H01L 27/1463* (2013.01); *H01L 27/14607* (2013.01); *H01L 27/14614* (2013.01); *H01L 27/14621* (2013.01); *H01L 27/14627* (2013.01); *H01L 27/14641* (2013.01); *H04N 5/378* (2013.01)

(58) Field of Classification Search
CPC ......... H01L 27/14645; H01L 27/14607; H01L 27/14614; H01L 27/1463; H01L 27/14641; H01L 27/14605; H04N 5/35563
See application file for complete search history.

(56) References Cited

U.S. PATENT DOCUMENTS 10,334,191 B1   6/2019 Yang et al.
2019/0131333 A1*  5/2019 Borthakur ......... H01L 27/14605

OTHER PUBLICATIONS

U.S. Appl. No. 16/674,964, filed Nov. 5, 2019,"Multi-Cell Pixel Array for High Dynamic Range Image Sensors," 43 pages.

* cited by examiner

*Primary Examiner* — Tucker J Wright
(74) *Attorney, Agent, or Firm* — Perkins Coie LLP

(57) ABSTRACT

A pixel cell includes a plurality of subpixels to generate image charge in response to incident light. The subpixels include an inner subpixel laterally surrounded by outer subpixels. A first plurality of transfer gates disposed proximate to the inner subpixel and a first grouping of outer subpixels. A first floating diffusion is coupled to receive the image charge from the first grouping of outer subpixels through a first plurality of transfer gates. A second plurality of transfer gates disposed proximate to the inner subpixel and the second grouping of outer subpixels. A second floating diffusion disposed in the semiconductor material and coupled to receive the image charge from each one of the second grouping of outer subpixels through the second plurality of transfer gates. The image charge in the inner subpixel is received by the first, second, or both floating diffusions through respective transfer gates.

38 Claims, 6 Drawing Sheets

HIGH DYNAMIC RANGE SPLIT PIXEL CMOS IMAGE SENSOR WITH LOW COLOR CROSSTALK

BACKGROUND INFORMATION

Field of the Disclosure

This disclosure relates generally to image sensors, and in particular but not exclusively, relates to high dynamic range complementary metal oxide semiconductor (CMOS) image sensors.

Background

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is read out as analog signals from the column bit lines and converted to digital values to produce digital images (i.e., image data) representing the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. One common technique to increase dynamic range is to merge multiple exposures captured with different exposure settings using standard (low dynamic range) image sensors into a single linear HDR image, which results in a much larger dynamic range image than a single exposure image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
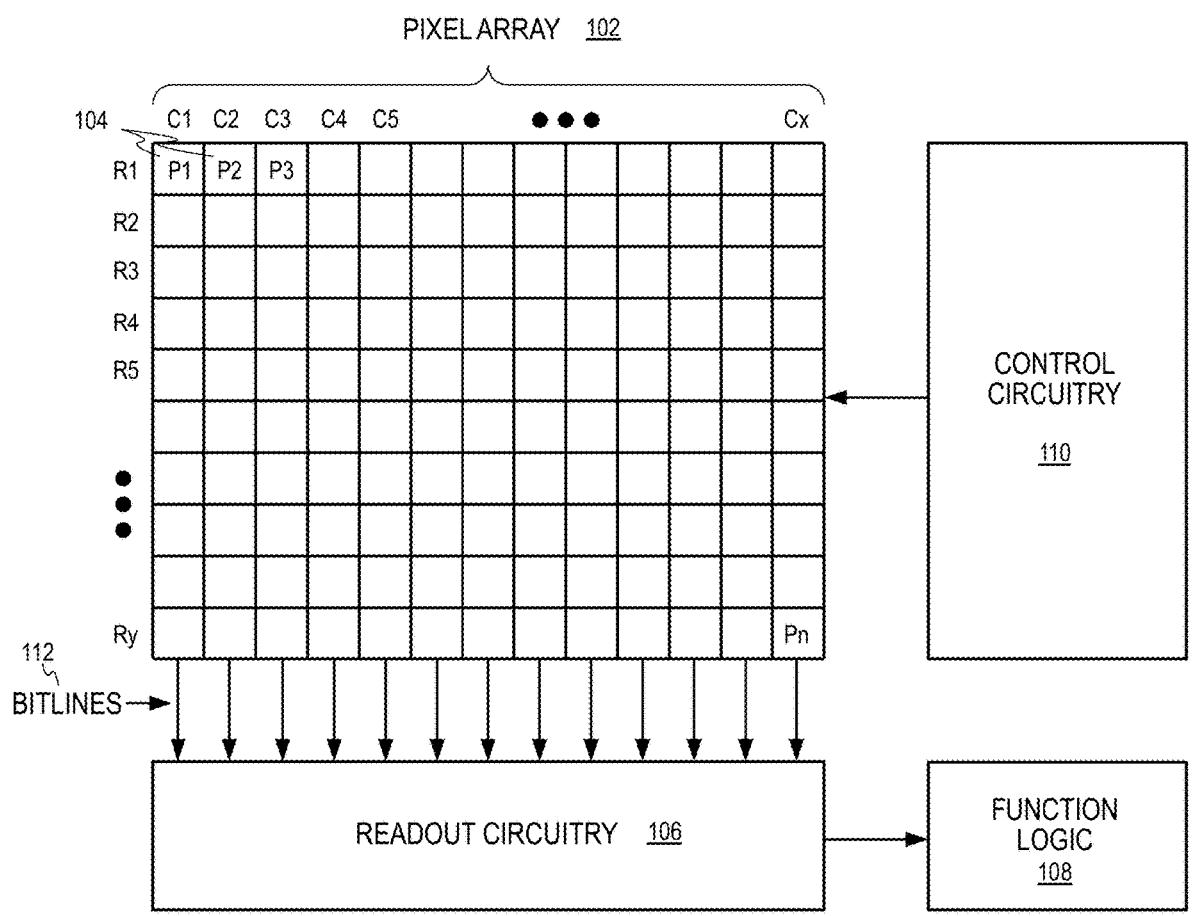
FIG. 1 illustrates one example of an imaging system including a pixel array with a high dynamic range split pixel CMOS image sensor with low color crosstalk in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including a pixel array with a high dynamic range split pixel CMOS image sensor with low color crosstalk are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under"

can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a pixel array with a high dynamic range split pixel CMOS image sensor with low color crosstalk are described. In various examples, the high dynamic range split pixel cell structures of the CMOS image sensors described herein include embedded split-diode structures. The pixel cells include plurality of subpixels that include a first subpixel configured as a small photodiode to sense bright light in high intensity lighting condition and a plurality of second subpixels that are configured as a large photodiode to sense light in dimmer or medium intensity lighting conditions to realize HDR imaging in accordance with the teachings of the present invention. In the various examples, all of the subpixels of the pixel cell are disposed beneath the same color filter, while one of the subpixels is also disposed beneath an attenuating layer. In the examples, an inner first subpixel is located in the center of the pixel cell is also surrounded by the remaining output second subpixels, which reduces color crosstalk. As will be disclosed, various examples of the pixel cell may utilize multiple floating diffusions with multiple transfer gates coupled to readout the image charge from the inner first subpixel. The multiple floating diffusions with multiple transfer gates coupled are also coupled to read out the image charge from the plurality of outer second subpixels, which provide the split pixel cell with mirror symmetry with respect to a diagonal axis of the split pixel cell in accordance with the teachings of the present invention.

To illustrate, FIG. 1 shows one example of an imaging system 100 including a pixel array with a high dynamic range split pixel CMOS image sensor with low color crosstalk in accordance with the teachings of the present invention. In the example, the imaging system 100 includes a pixel array 102, control circuitry 110, readout circuitry 106, and function logic 108. In one example, pixel array 102 is a two-dimensional (2D) array including a plurality of pixel cells 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

As will discussed in greater detail below, in one example, each pixel cell 104 is configured as a split-diode HDR pixel cell with an inner first subpixel that is surrounded by a plurality of outer second subpixels to photogenerate image charge in response to incident light. After each pixel cell 104 has acquired its image charge, the corresponding analog image charge data signals are read out by readout circuitry 106 through column bitlines 112. In the various examples, the image charge data from each row of pixel cells 104 is read out through column bitlines 112 by readout circuitry 106. In the various examples, the analog image charge signals are converted to digital values, which are then transferred to function logic 106 in accordance with teachings of the present invention. In various examples, readout circuitry 106 may include amplification circuitry, column readout circuitry that includes analog-to-digital conversion (ADC) circuitry, or otherwise. Function logic 108 may simply store the image data or even manipulate the image data by applying post image effects (e.g., crop, rotate, remove red eye, adjust brightness, adjust contrast, or otherwise). In one example, readout circuitry 106 may read out one row of image data at a time along column bitlines 112 (illustrated) or may read out the image data using a variety of other techniques (not illustrated), such as a serial read out or a full parallel read out of all pixel cells 104 simultaneously.

In one example, control circuitry 110 is coupled to pixel array 102 to control operational characteristics of pixel array 102. For instance, in one example control circuitry 110 generates the transfer gate signals and other control signals to control the transfer and readout of image data from all of the inner and outer subpixels of each split pixel cell 104 of pixel array 102. In addition, control circuitry 110 may generate a shutter signal for controlling image acquisition. In one example, the shutter signal is a global shutter signal for simultaneously enabling all pixel cells 104 within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

Figure 2:
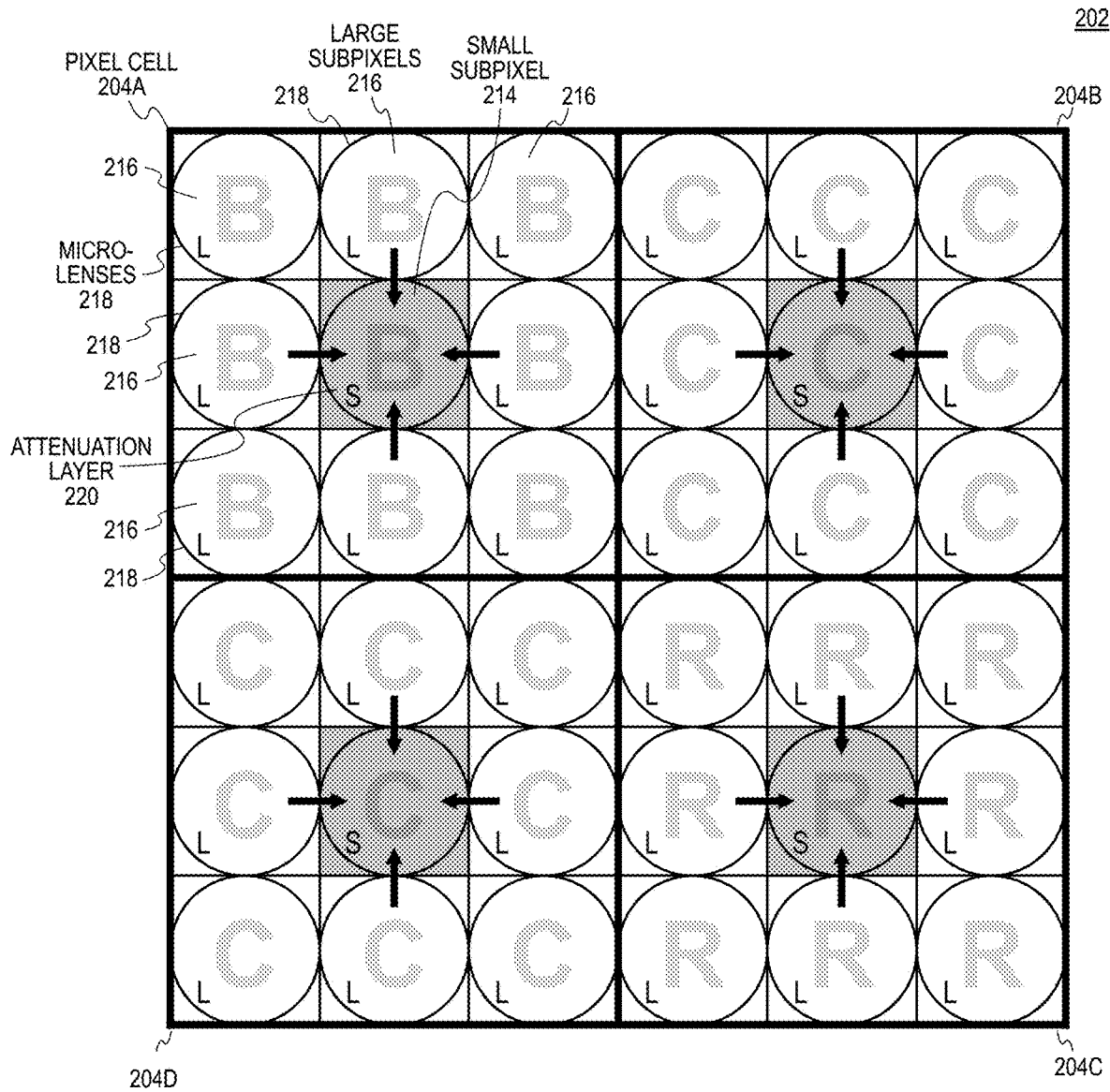
FIG. 2 illustrates increased detail one example of a top view of a pixel array with a high dynamic range split pixel CMOS image sensor with low color crosstalk in accordance with the teachings of the present disclosure.

FIG. 2 illustrates increased detail of one example of a top view of a pixel array 202 with a high dynamic range split pixel CMOS image sensor with low color crosstalk in accordance with the teachings of the present disclosure. It is appreciated the pixel array 202 of FIG. 2 may be one example of the pixel array 102 as shown in FIG. 1, and that similarly named and numbered elements described above are coupled and function similarly below.

As shown in the depicted example, pixel array 202 includes a plurality pixel cells (or split pixel cells) 204. Each one of the pixel cells 204 includes a first subpixel 214 and a plurality of second subpixels 216. As shown in the example, the first subpixel 214 is located in the center of each pixel cell 204 and may therefore also be referred to as an inner subpixel (or first inner subpixel) 214 that is laterally surrounded in a semiconductor material by the plurality of second subpixels 216, which may also be referred to as plurality of outer subpixels (or second outer subpixels) 216. In the example, each one of the plurality of subpixels 214 and 216 includes a photodiode disposed in the semiconductor material to photogenerate image charge in response to incident light. In operation, each first inner subpixel 214 is configured to be a small "S" photodiode of each respective split pixel cell 204 to sense bright light in high intensity lighting conditions, and the plurality of second outer subpixels 216 are collectively configured to be a large "L" photodiode of each respective split pixel cell 204 to sense light in dimmer or medium intensity lighting conditions to realize HDR imaging.

In the specific example shown in FIG. 2, it is noted that pixel array 202 is illustrated as a 2×2 array for explanation purposes with pixel cells 204A and 204B in the top row, and pixel cells 204C and 204D in the bottom row. It is appreciated of course that in other examples, pixel array 202 may include a different number of rows and columns.

The depicted example also illustrates that a color filter array is disposed over the pixel array 202. In various embodiments, the color filter array includes color filters arranged according to a specific color pattern, such as a Bayer pattern or mosaic of red, blue, and panchromatic filters (e.g., B, C, C, R) to transmit the respective light wavelength accordingly. In the example, a blue "B" color filter is disposed over pixel cell 204A, a red "R" color filter is disposed over pixel cell 204C, and a panchromatic or clear "C" color filter is disposed over pixel cell 204B and pixel cell 204D. In other examples, it is appreciated that the color filter array may include filters having different colors. It is appreciated, however, that the same color filter is disposed over every subpixel 214 and 216 of each respective pixel cell 204 in accordance with the teachings of the present invention.

The example shown in FIG. 2 also illustrates that a plurality of microlenses 218 is disposed over each pixel cell 204. In the illustrated example, the plurality of microlenses 218 are arranged in a 3×3 array over each pixel cell 204. As such, the plurality of microlenses 218 over each pixel cell 204 includes an inner microlens 218 disposed over the inner subpixel 214, as well as a plurality of outer microlenses 218 disposed over the plurality of outer subpixels 216. Thus, in the depicted example, the plurality of subpixels 214 and 216 of each pixel cell 204 is optically coupled to receive incident light through at least one of the plurality of microlenses 218.

The depicted example also illustrates that the first subpixel 214 or inner subpixel of each pixel cell 204, which is configured to function as a small "S" photodiode of the pixel cell 204, is optically coupled to receive incident light through an attenuation layer 220 disposed over the first subpixel 214. In one example, the attention layer 220 functions as a neutral density (ND) filter over the first subpixel. In the example, it is appreciated that each one of the plurality of second subpixels 216 or outer subpixels, which are configured to function together as a large "L" photodiode of the pixel cell 204, are optically coupled to receive the incident light without passing through the attenuation layer 220. The light sensitivity of each plurality of second subpixels 216 is greater than the first subpixel 214.

In sum, it is appreciated that the example of FIG. 2 shows that each split pixel cell 204 in pixel array 202 is divided into a plurality of second subpixels 216 (e.g., 8 second subpixels 216 for each pixel cell 204 in FIG. 2) that are grouped as a large "L" photodiode (e.g., LPD) and one first subpixel 214 configured as a small "S" photodiode (e.g., SPD). The inner "S" subpixel 214 is located in the center of the split pixel 204 under the attenuation layer 220 and is surrounded in the semiconductor material by the plurality outer "L" second subpixels 216. As such, the center subpixel 214 acts as the small "S" photodiode and has a smaller full well capacity (i.e., holds a smaller number of photogenerated image charges) compared to the combined total full well capacity of the plurality of second subpixels 216 that function together to act as a large "L" photodiode of the split pixel cell 204.

The example shown in FIG. 2 also illustrates the crosstalk that can occur in the small "S" photodiode or first subpixel 214 with the thick arrows entering each first subpixel 214 representing the stray light from the neighboring second subpixels 216 from the "top," "bottom," "left," and "right" sides in FIG. 2. Since each first subpixel 214 is surrounded in the semiconductor on all four lateral sides by second subpixels 216, all of which are covered by the same color filter, then the crosstalk from neighboring subpixels are the same color crosstalk in accordance with the teachings of the present invention. Therefore, any large "L" photodiode to small "S" photodiode crosstalk of different colors is eliminated in pixel array 202 in accordance with the teachings of the present invention. As such, the remaining crosstalk to the small "S" first subpixel 214 is only from the same color second subpixel 216, which results in no negative consequences to color reconstruction in accordance with the teachings of the present invention.

Figure 3:
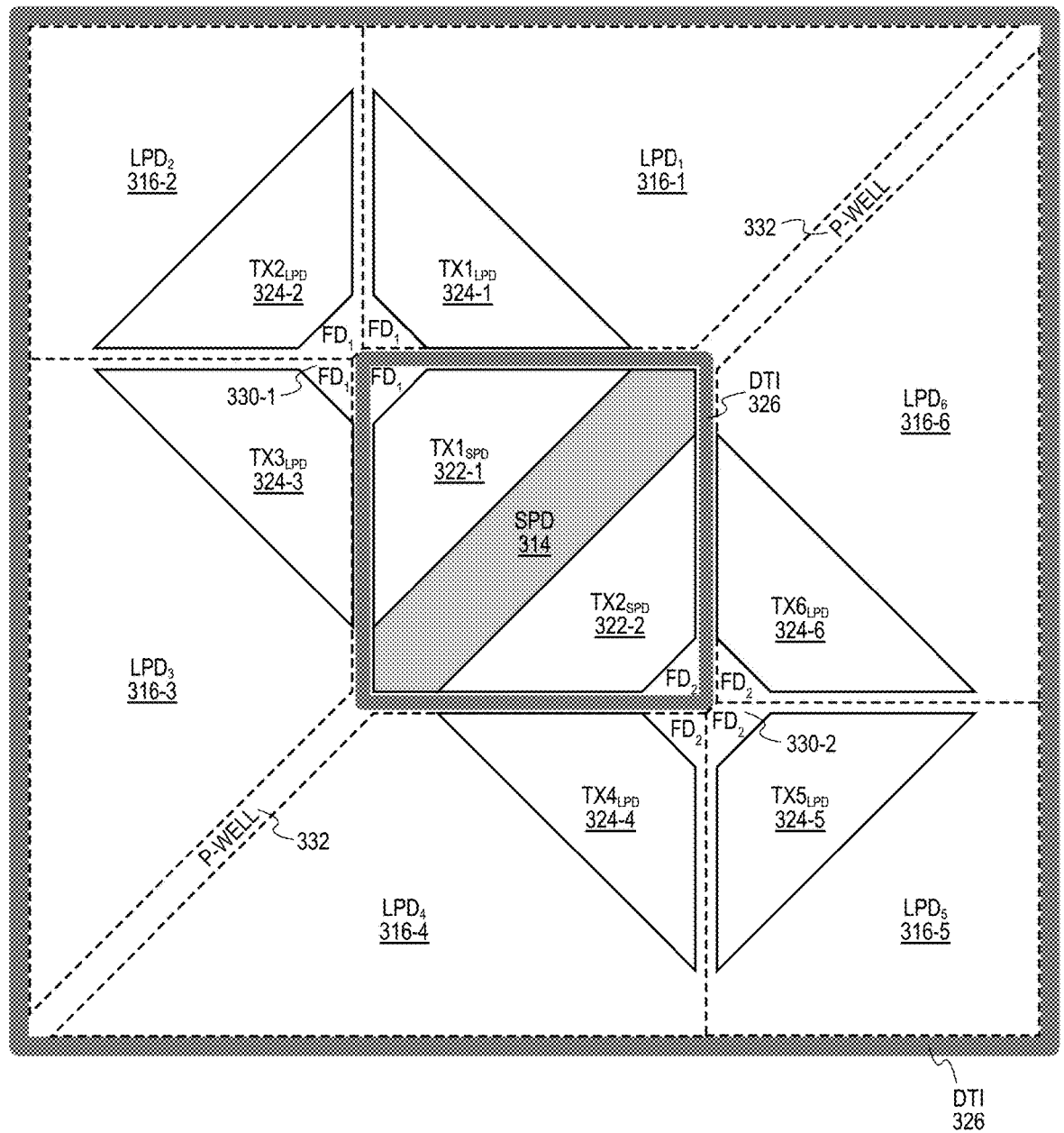
FIG. 3 illustrates one example layout view of an example split pixel cell of a pixel array of a high dynamic range CMOS image sensor with low color crosstalk in accordance with the teachings of the present disclosure.

FIG. 3 illustrates one example layout view of an example split pixel cell 304 of a pixel array of a high dynamic range CMOS image sensor with low color crosstalk in accordance with the teachings of the present disclosure. It is appreciated the pixel cell 304 of FIG. 3 may be one example of one of the pixel cells 204 of FIG. 2 or of one of the pixel cells 104 of the pixel array 102 as shown in FIG. 1, and that similarly named and numbered elements described above are coupled and function similarly below.

As shown in the depicted example, pixel cell 304 includes a first subpixel 314 located in the center of pixel cell 304 and surrounded by a plurality of second subpixels 316 in a semiconductor material. The semiconductor material can be a silicon substrate, a doped silicon substrate (e.g., p-type doped substrate, or n-type doped substrate), a bulk of silicon substrate, silicon on insulator (SOI) substrate, or any other suitable semiconductor substrate. In the depicted example, first subpixel 314 is configured as an inner small photodiode (SPD) and the plurality of second subpixels 316 are configured to function together as an outer large photodiode (LPD). As such, the first subpixel may also be referred to and is illustrated in FIG. 3 as SPD 314, and the plurality of second subpixels 316 may also be referred to and are illustrated in FIG. 3 as $LPD_1$ 316-1, $LPD_2$ 316-2, $LPD_3$ 316-3, $LPD_4$ 316-4, $LPD_5$ 316-5, and $LPD_6$ 316-6, respectively.

In the depicted example, pixel cell 304 also includes a deep trench isolation (DTI) structure 326 disposed in the semiconductor material and surrounding the inner subpixel 314 to separate the inner subpixel 314 from the plurality of outer subpixels 316 in the semiconductor material. In addition, pixel cell 304 further includes a DTI structure 326 disposed in the semiconductor material and surrounding the pixel cell 304 as shown. DTI structure 326 can be interconnected in a grid-like pattern to isolate between subpixels 314, 316 and pixel cells. As such, the DTI structure 326 disposed around the perimeter of pixel cell 304 as shown is configured to isolate the pixel cell 304 from other pixel cells of the pixel array having different color filters in accordance with the teachings of the present invention.

In the example illustrated in FIG. 3, the plurality of second subpixels 316 are separated into two groupings, for example by photodiode implants. The first grouping of second subpixels 316 includes $LPD_1$ 316-1, $LPD_2$ 316-2, and $LPD_3$ 316-3. The second grouping of second subpixels 316 includes $LPD_4$ 316-4, $LPD_5$ 316-5, and $LPD_6$ 316-6. In one example, an optional P-well (or P-type doped isolation well) 332 may also be included in the semiconductor material separating the first grouping of outer subpixels $LPD_1$ 316-1, $LPD_2$ 316-2, and $LPD_3$ 316-3 from the second grouping of outer subpixels $LPD_4$ 316-4, $LPD_5$ 316-5, and $LPD_6$ 316-6 as shown.

In one example, pixel cell 304 also includes two floating diffusions 330. The first floating diffusion is illustrated in the example depicted in FIG. 3 as first floating diffusion $FD_1$ 330-1, which is disposed proximate to one corner (e.g., upper left corner in FIG. 3) of the inner subpixel SPD 314 and the first grouping of outer subpixels $LPD_1$ 316-1, $LPD_2$ 316-2, and $LPD_3$ 316-3 as shown. The second floating diffusion is illustrated in the example depicted in FIG. 3 as second floating diffusion $FD_2$ 330-2, which is disposed proximate to another corner (e.g., lower right corner in FIG. 3) of the inner subpixel SPD 314 and the second grouping of outer subpixels $LPD_4$ 316-4, $LPD_5$ 316-5, and $LPD_6$ 316-6 as shown.

In the example, a first plurality of transfer gates $TX1_{SPD}$ 322-1, $TX1_{LPD}$ 324-1, $TX2_{LPD}$ 324-2, and $TX3_{LPD}$ 324-3 are disposed proximate to the first floating diffusion $FD_1$ 330-1 as well as the inner subpixel SPD 314 and the first grouping of outer subpixels $LPD_1$ 316-1, $LPD_2$ 316-2, and $LPD_3$ 316-3 as shown. Similarly, a second plurality of transfer gates $TX2_{SPD}$ 322-2, $TX4_{LPD}$ 324-4, $TX5_{LPD}$ 324-5, and $TX6_{LPD}$ 324-6 are disposed proximate to the second floating diffusion $FD_2$ 330-2 as well as the inner subpixel SPD 314 and the second grouping of outer subpixels $LPD_4$ 316-4, $LPD_5$ 316-5, and $LPD_6$ 316-6 as shown.

In operation, the first floating diffusion $FD_1$ 330-1 is coupled to receive the image charge from either the inner subpixel SPD 314 or from each one of the first grouping of outer subpixels $LPD_1$ 316-1, $LPD_2$ 316-2, and $LPD_3$ 316-3 through the first plurality of transfer gates $TX1_{SPD}$ 322-1, $TX1_{LPD}$ 324-1, $TX2_{LPD}$ 324-2, and $TX3_{LPD}$ 324-3, respectively. Similarly, the second floating diffusion $FD_2$ 330-2 is coupled to receive the image charge from either the inner subpixel SPD 314 or from each one of the second grouping of outer subpixels $LPD_4$ 316-4, $LPD_5$ 316-5, and $LPD_6$ 316-6 through the second plurality of transfer gates $TX2_{SPD}$ 322-2, $TX4_{LPD}$ 324-4, $TX5_{LPD}$ 324-5, and $TX6_{LPD}$ 324-6, respectively.

In one example, it is noted that the first floating diffusion $FD_1$ 330-1 the second floating diffusion $FD_2$ 330-2 are coupled or electrically connected together through a metal line (not illustrated in FIG. 3). Therefore, it is appreciated that the photogenerated image charge from the inner subpixel SPD 314 may be read out through either the first floating diffusion $FD_1$ 330-1 through the transfer gate $TX1_{SPD}$ 322-1, the second floating diffusion $FD_2$ 330-2 through the transfer gate $TX2_{SPD}$ 322-1, or through both.

In addition, in the depicted example, the large photodiode including the first grouping of outer subpixels $LPD_1$ 316-1, $LPD_2$ 316-2, and $LPD_3$ 316-3 and the second grouping of outer subpixels $LPD_4$ 316-4, $LPD_5$ 316-5, and $LPD_6$ 316-6 may be read out through the first floating diffusion $FD_1$ 330-1 and the second floating diffusion $FD_2$ 330-2 through the transfer gates $TX1_{LPD}$ 324-1, $TX2_{LPD}$ 324-2, and $TX3_{LPD}$ 324-3 and through the transfer gates $TX4_{LPD}$ 324-4, $TX5_{LPD}$ 324-5, and $TX6_{LPD}$ 324-6, respectively. In one example, each of the first grouping of outer subpixels $LPD_1$ 316-1, $LPD_2$ 316-2, and $LPD_3$ 316-3 and the second grouping of outer subpixels $LPD_4$ 316-4, $LPD_5$ 316-5, and $LPD_6$ 316-6 include an N-type photodiode implant formed in a P-type semiconductor substrate. N-type photodiode implants for the surrounding outer subpixels are divided equally along the diagonal cut of pixel cell 304 as shown. As such, it is appreciated that the first grouping of outer subpixels $LPD_1$ 316-1, $LPD_2$ 316-2, and $LPD_3$ 316-3 and the second grouping of outer subpixels $LPD_4$ 316-4, $LPD_5$ 316-5, and $LPD_6$ 316-6 have mirror symmetry across the diagonal axis of pixel cell 304 as shown. In other examples, the polarities may be reversed, such that each of the first grouping of outer subpixels $LPD_1$ 316-1, $LPD_2$ 316-2, and $LPD_3$ 316-3 and the second grouping of outer subpixels $LPD_4$ 316-4, $LPD_5$ 316-5, and $LPD_6$ 316-6 include a P-type photodiode implant formed in an N-type semiconductor substrate.

In one example, the LPD transfer gates $TX1_{LPD}$ 324-1, $TX2_{LPD}$ 324-2, $TX3_{LPD}$ 324-3, $TX4_{LPD}$ 324-4, $TX5_{LPD}$ 324-5, and $TX6_{LPD}$ 324-6 are all coupled or connected together at the polysilicon level or at the metal level in various examples. Thus, in one example, in order to read out the LPD image data signal of pixel cell 304, all six of the LPD transfer gates $TX1_{LPD}$ 324-1, $TX2_{LPD}$ 324-2, $TX3_{LPD}$ 324-3, $TX4_{LPD}$ 324-4, $TX5_{LPD}$ 324-5, and $TX6_{LPD}$ 324-6 are coupled together and turned on together during a charge transfer period of a high dynamic range CMOS image sensor to transfer image charges from the respective outer subpixels $LPD_1$ 316-1, $LPD_2$ 316-2, $LPD_3$ 316-3, $LPD_4$ 316-4, $LPD_5$ 316-5, and $LPD_6$ 316-6 of the LPD to the first floating diffusion $FD_1$ 330-1 and second floating diffusion $FD_2$ 330-2, respectively.

In one example, transfer gate $TX1_{SPD}$ 322-1 and the transfer gate $TX1_{SPD}$ 322-2 are coupled or connected together at the polysilicon level or at the metal level. In that example, both transfer gates $TX1_{SPD}$ 322-1 and $TX1_{SPD}$ 322-2 turned on together during a charge transfer period of the image sensor to transfer image charges from the inner subpixel SPD 314 to the first floating diffusion $FD_1$ 330-1 and second floating diffusion $FD_2$ 330-2.

In another example, either transfer gate $TX1_{SPD}$ 322-1 or the transfer gate $TX1_{SPD}$ 322-2 is turned on during the charge transfer period of the high dynamic range CMOS image sensor to transfer image charges from the inner subpixel SPD 314 to the respective first floating diffusion $FD_1$ 330-1 or second floating diffusion $FD_2$ 330-2. For example, during the charge transfer period of the high dynamic range CMOS image sensor, the transfer gate $TX1_{SPD}$ 322-1 is biased to turn on (e.g., positive voltage) while transfer gate $TX1_{SPD}$ 322-2 is biased to be off (e.g., negative biasing) to transfer image charges from the inner subpixel SPD 314 to the first floating diffusion $FD_1$ 330-1. In some embodiments, one of the transfer gates $TX1_{SPD}$ 322-1 or the transfer gate $TX1_{SPD}$ 322-2 is configured as non-functional or dummy gate, and the other transfer gate is used for controlling image charge transfer such that only one of the first floating diffusion $FD_1$ 330-1 and second floating diffusion $FD_2$ 330-2 is used to read out image charges photogenerated by the inner subpixel SPD 314 in response to incident light. For example, transfer gate $TX1_{SPD}$ 322-1 can be configured to constantly operate in the off-state, e.g., biased with a negative voltage, and transfer gate $TX1_{SPD}$ 322-2 is turned on during the charge transfer period of the high dynamic range CMOS image sensor to transfer all photogenerated image charges from the inner subpixel SPD 314 to the second floating diffusion $FD_2$ 330-2. In this example, the first floating diffusion $FD_1$ 330-1 thus only receives image charges photogenerated by outer subpixels $LPD_1$ 316-1, $LPD_2$ 316-2, $LPD_3$ 316-3 of the LPD.

Referring briefly back to the example depicted in FIG. 2 for reference, as well as to FIG. 3, it is noted that the plurality of subpixels 314 are 315 are optically coupled to receive incident light through a plurality of microlenses 218. In the illustrated example, however, it is appreciated that there is a different or greater number (e.g., 8) of outer microlenses 218 in FIG. 2 as shown compared to the number (e.g., 6) of outer LPD subpixels $LPD_1$ 316-1, $LPD_2$ 316-2, $LPD_3$ 316-3, $LPD_4$ 316-4, $LPD_5$ 316-5, and $LPD_6$ 316-6 in FIG. 3 as shown.

In one embodiment, one outer microlenses 218 may be arranged to cover one or two outer LPD subpixels $LPD_1$ 316-1, LPD$_2$ 316-2, LPD$_3$ 316-3, LPD$_4$ 316-4, LPD$_5$ 316-5, and LPD$_6$ 316-6 and direct light onto one or two outer LPD subpixels LPD$_1$ 316-1, LPD$_2$ 316-2, LPD$_3$ 316-3, LPD$_4$ 316-4, LPD$_5$ 316-5, and LPD$_6$ 316-6, while one inner microlens 218 is arranged to cover the inner SPD subpixel SPD 314. For example, one outer microlens 218 formed to cover outer LPD subpixels LPD$_1$ 316-1 and LPD$_6$ 316-6 and configured to direct light onto outer LPD subpixels LPD$_1$ 316-1 and LPD$_6$ 316-6. For example, one outer microlens 218 is formed to cover outer LPD subpixel LPD$_1$ 316-2 entirely and is configured to direct light onto outer LPD subpixels LPD$_1$ 316-2. In one embodiment, one outer LPD subpixel is covered by more than one outer microlenses 218. For example, outer LPD subpixel LPD$_1$ 316-1 is covered by two outer microlenses and received light through both outer microlenses 218.

Therefore, it is appreciated that in the one example, there may be a different number of outer LPD subpixels 316 than the number of outer microlenses 218 in accordance with the teachings of the present invention.

It is further appreciated that in the illustrated example, there are six photodiode implants forming outer LPD subpixels LPD$_1$ 316-1, LPD$_2$ 316-2, LPD$_3$ 316-3, LPD$_4$ 316-4, LPD$_5$ 316-5, and LPD$_6$ 316-6. In other embodiments, there may be more or less number photodiode implants forming outer LPD subpixels surrounding inner subpixel 314 in accordance with the teachings of the present invention. For example, there may be four outer LPD subpixels.

Figure 4:
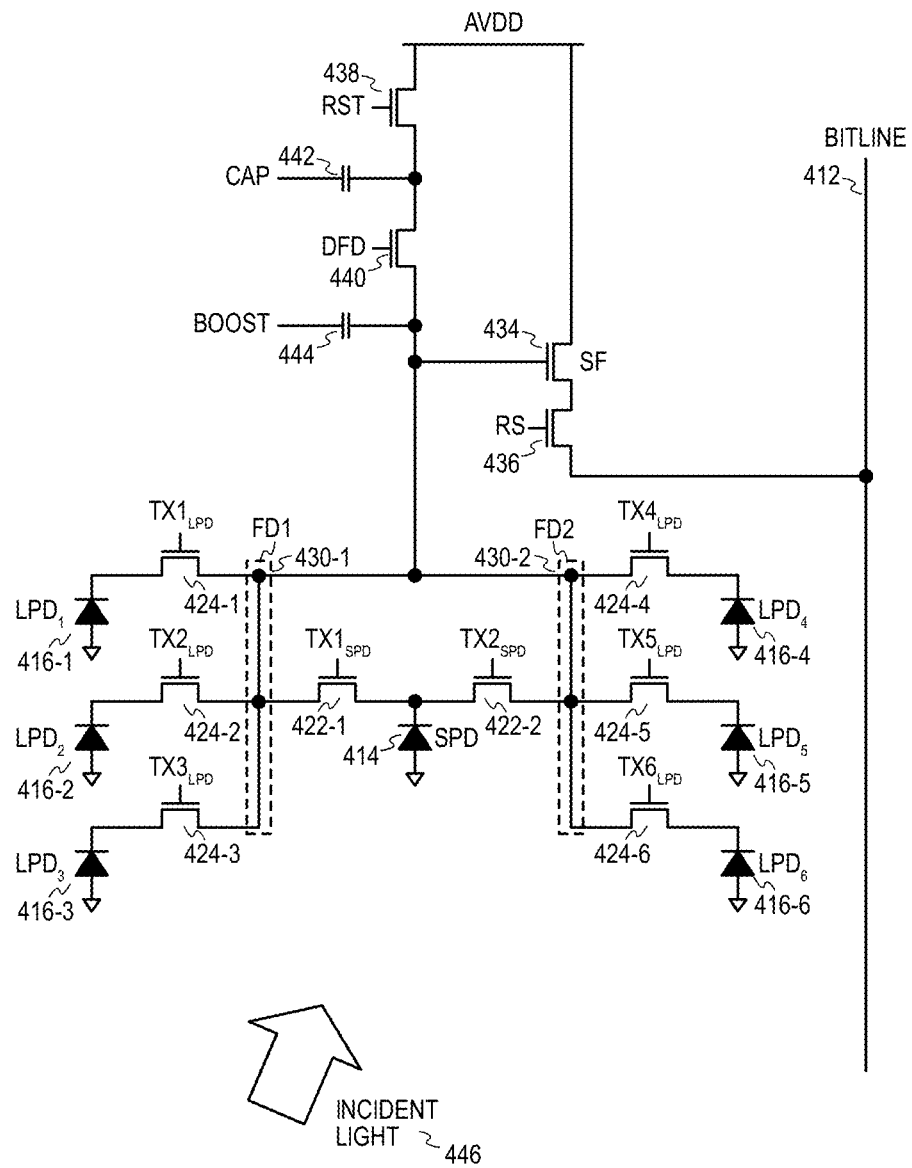
FIG. 4 illustrates one example schematic of an example split pixel cell of a pixel array of a high dynamic range CMOS image sensor with low color crosstalk in accordance with the teachings of the present disclosure.

FIG. 4 illustrates one example schematic of an example split pixel cell 404 of a pixel array of a high dynamic range CMOS image sensor with low color crosstalk in accordance with the teachings of the present disclosure. It is appreciated the example schematic of pixel cell 404 of FIG. 4 may be one example of pixel cell 304 of FIG. 3 or of one of the pixel cells 204 of FIG. 2 or of one of the pixel cells 104 of the pixel array 102 as shown in FIG. 1, and that similarly named and numbered elements described above are coupled and function similarly below.

As shown, pixel cell 404 includes a small photodiode (SPD) including SPD subpixel 414 and a large photodiode (LPD) 416 including subpixels LPD$_1$ 416-1, LPD$_2$ 416-2, LPD$_3$ 416-3, LPD$_4$ 416-4, LPD$_5$ 416-5, and LPD$_6$ 416-6 as shown. In the example, SPD 414 as well as LPD$_1$ 416-1, LPD$_2$ 416-2, LPD$_3$ 416-3, LPD$_4$ 416-4, LPD$_5$ 416-5, and LPD$_6$ 416-6 are in form of photodiode configured to photogenerate image charge in response to incident light 446.

In the depicted example, pixel cell 404 also includes a first floating diffusion FD1 430-1 and a second floating diffusion FD2 430-2. In operation, first floating diffusion FD1 430-1 may be coupled to receive image charge from SPD 414 through transfer gate 422-1 in response to transfer control signal TX1$_{SPD}$, or first floating diffusion FD1 430-1 may also be coupled to receive image charge from LPD$_1$ 416-1, LPD$_2$ 416-2, and LPD$_3$ 416-3 through transfer gates 424-1, 424-2, and 424-3 in response to transfer control signals TX1$_{LPD}$, TX2$_{LPD}$, and TX3$_{LPD}$, respectively. In other words, first floating diffusion FD1 430-1 may function as a drain to transfer transistors that include transfer gates 422-1, 424-1, 424-2, and 424-3. Similarly, photodiodes LPD$_1$ 416-1, LPD$_2$ 416-2, and LPD$_3$ 416-3 of large photodiode 416 function as source to transfer transistors that include transfer gates 424-1, 424-2, and 424-3 and small photodiode SPD 414 function as source to transfer gate 422-1. Similarly, second floating diffusion FD2 430-2 may be coupled to receive image charge from SPD 414 through transfer gate 422-2 in response to transfer control signal TX2$_{SPD}$, or second floating diffusion FD2 430-2 may be coupled to receive image charge from LPD$_4$ 416-4, LPD$_5$ 416-5, and LPD$_6$ 416-6 through transfer gates 424-4, 424-5, and 424-6 in response to transfer control signals TX4$_{LPD}$, TX5$_{LPD}$, and TX6$_{LPD}$, respectively. Second floating diffusion FD1 430-2 may function as a drain to transfer transistors that include transfer gates 422-2, 424-4, 424-5, and 424-6. Photodiodes LPD$_1$ 416-4, LPD$_2$ 416-5, and LPD$_3$ 416-36 of large photodiode 416 function as source to transfer transistors that include transfer gates 424-4, 424-5, and 424-6 and small photodiode SPD 414 function also as source to transfer gate 422-2.

In one example, it is noted that transfer control signals TX1$_{SPD}$ and TX2$_{SPD}$ may be coupled together to turn on and off transfer gates 422-1 and 422-2 together. In addition, transfer control signals TX1$_{LPD}$, TX2$_{LPD}$, TX3$_{LPD}$, TX4$_{LPD}$, TX5$_{LPD}$, and TX6$_{LPD}$ may be coupled together to turn on and off transistors 424-1, 424-2, 424-3, 424-4, 424-5, and 424-6 together.

In one example, it is appreciated that transfer control signals TX1$_{SPD}$ and TX2$_{SPD}$ may be used to control the operation of transfer gates 422-1 and 422-2 independently. In one embodiment, only one of transfer gates 422-1 and 422-2 is used to transfer image charges from SPD 414 to the respective floating diffusion e.g., either first floating diffusion FD1 430-1 or second floating diffusion FD2 430-2 for read out image charges photogenerated by SPD 414. For example, transfer gate 422-1 can be controlled to always operate in an off state, e.g., the transfer control signals TX1$_{SPD}$ can be configured to be a negative biasing voltage signal and negative biasing the gate of transfer gates 422-1, while transfer gate 422-2 can be controlled with transfer control signal TX2$_{SPD}$ to transfer photogenerated image charges from SPD 414 to the second floating diffusion FD2 430-2 during change transfer operation. Alternatively, the gate of transfer gate 422-2 can be constantly negatively biased with transfer control signal TX2$_{SPD}$ during the operation of image sensor while transfer gate 422-1 is controlled with transfer control signal TX1$_{SPD}$ to transfer photogenerated image charges from SPD 414 to the first floating diffusion FD1 430-1 during change transfer operation for read out.

As shown in the illustrated example, pixel cell 404 also includes a source follower (SF) transistor 434 coupled to a voltage supply AVDD and having a gate coupled to the first floating diffusion FD1 430-1 and coupled to the second floating diffusion FD2 430-2 to generate an image data signal in response to the image charge transferred to the first floating diffusion FD1 430-1 and the second floating diffusion FD2 430-2. A row select transistor 436 is coupled between the source follower transistor 434 and a bitline 412 to output the image data signal from the source follower transistor 434 to the bitline 412. In the example, a reset transistor 438 is coupled between the voltage supply AVDD and the gate of the source follower transistor 434 to reset the pixel cell 404 in response to a reset control signal RST.

In one example, pixel cell 404 may also include a dual floating diffusion (DFD) transistor 440 coupled between the reset transistor 438 and the gate of the source follower transistor 434. In the example, a first capacitor 442 is coupled to the dual floating diffusion transistor 440. In the example, the first capacitor 442 is used to achieve switchable low conversion gain of pixel cell 404 providing additional dynamic range capabilities to pixel cell 404 if desired. In one example, the capacitor 442 is further coupled to receive a CAP control signal. In one example, the CAP control signal is a constant biasing voltage applied to the capacitor 442 adjusting capacitance the capacitor 442 to store overflowing image charges from subpixels in pixel cell 404 during operation of the HDR CMOS image sensor.

However, in another example, it is appreciated that the dual floating diffusion transistor 440 and first capacitor 442 may be opted out. In one example, a second capacitor 444 may also be coupled to the gate of the source follower transistor 434 as shown. In one example, the second capacitor may be coupled to receive a BOOST control signal as shown.

Figure 5A:
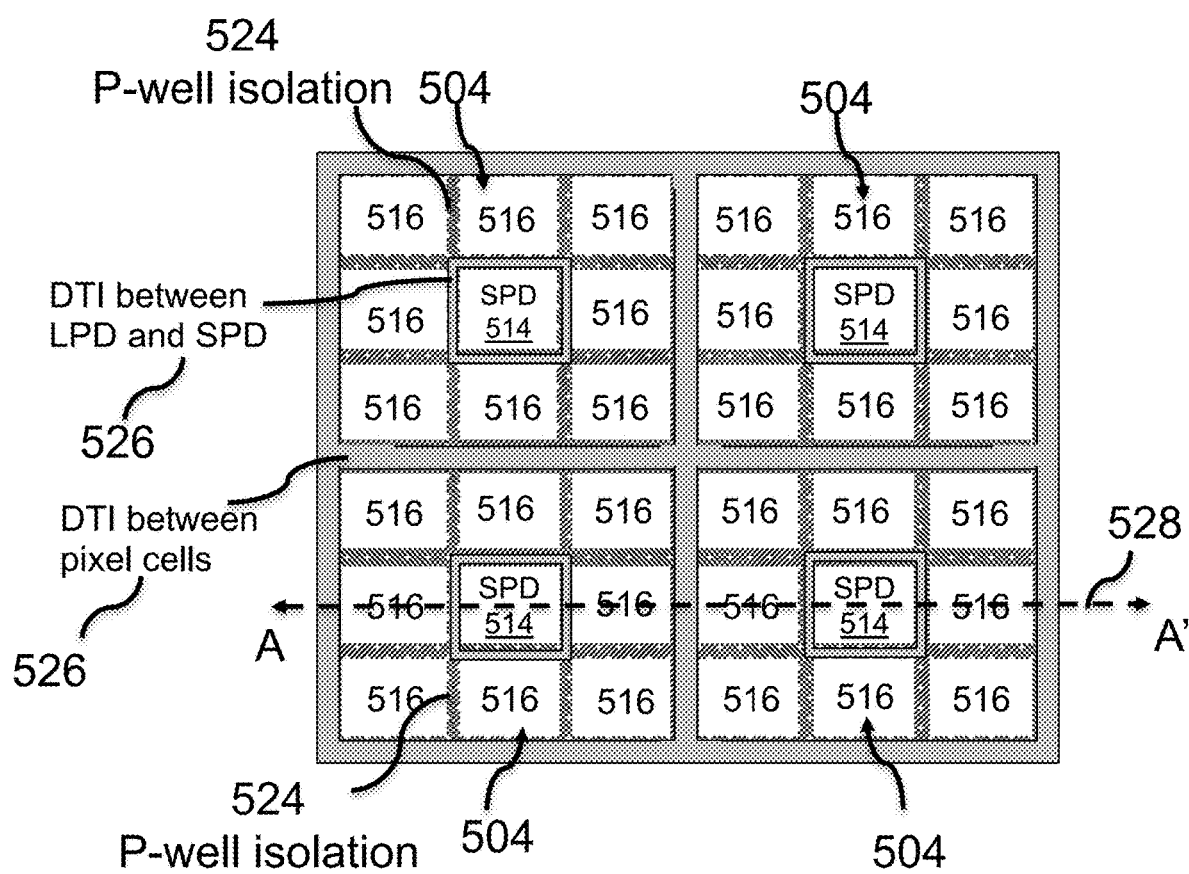
FIG. 5A illustrates another top view example of a pixel array with a high dynamic range split pixel CMOS image sensor with low color crosstalk in accordance with the teachings of the present disclosure.

FIG. 5A illustrates another top view example of a pixel array 502 with a high dynamic range split pixel CMOS image sensor with low color crosstalk in accordance with the teachings of the present disclosure. It is appreciated the top view example of pixel array 502 of FIG. 5A may be one example of a top view of the pixel cell 404 of FIG. 4 or of pixel cell 304 of FIG. 3 or of pixel array 202 of FIG. 2 or of pixel array 102 as shown in FIG. 1, and that similarly named and numbered elements described above are coupled and function similarly below. It is appreciated that the top view example of pixel array 502 of FIG. 5A shares similarities with the example top view of pixel array 202 illustrated in FIG. 2.

For instance, as shown in the depicted example depicted in FIG. 5A, pixel array 502 includes a plurality pixel cells (or split pixel cells) 504. In one example, each of the plurality pixel cells (or split pixel cells) 504 is placed under a color filter. Adjacent pixel cells 504 are placed under different color filters. Each one of the pixel cells 504 includes a first subpixel 514 that is surrounded by a plurality of second subpixels 516. In one example, a P-type (e.g., boron) doped well 524 is disposed to provide electrical isolation between individual second subpixels 516. As shown in the example, the first subpixel 514 is located in the center of each pixel cell 504 and may therefore also be referred to as an inner subpixel (or first inner subpixel) 514 that is laterally surrounded in a semiconductor material by the plurality of second subpixels 516, which may also be referred to as plurality of outer subpixels (or second outer subpixels) 516. In the example, each one of the plurality of subpixels 514 and 516 includes a photodiode disposed in the semiconductor material to photogenerate image charge in response to incident light. In operation, each first inner subpixel 514 is configured to be a small photodiode (SPD) of each respective split pixel cell 504 to sense bright light in high intensity lighting conditions, and the plurality of second outer subpixels 516 are collectively configured to be a large photodiode (LPD) of each respective split pixel cell 504 to sense light in dimmer or medium intensity lighting conditions to realize HDR imaging. As shown in the depicted example, a deep trench isolation (DTI) structure 526 is formed such that it is between the SPD 514 and LPD 516 within each split pixel cell 504 and is also formed between the adjacent color pixel cells 504 to provide isolation. In one embodiment, the P-type doped well 524 is further disposed surrounding DTI structure 526 providing passivation to trap sites on interface between sidewalls of DTI structure 526 and semiconductor material 556 to further reduce dark current associated with pixel cell 504.

Figure 5B:
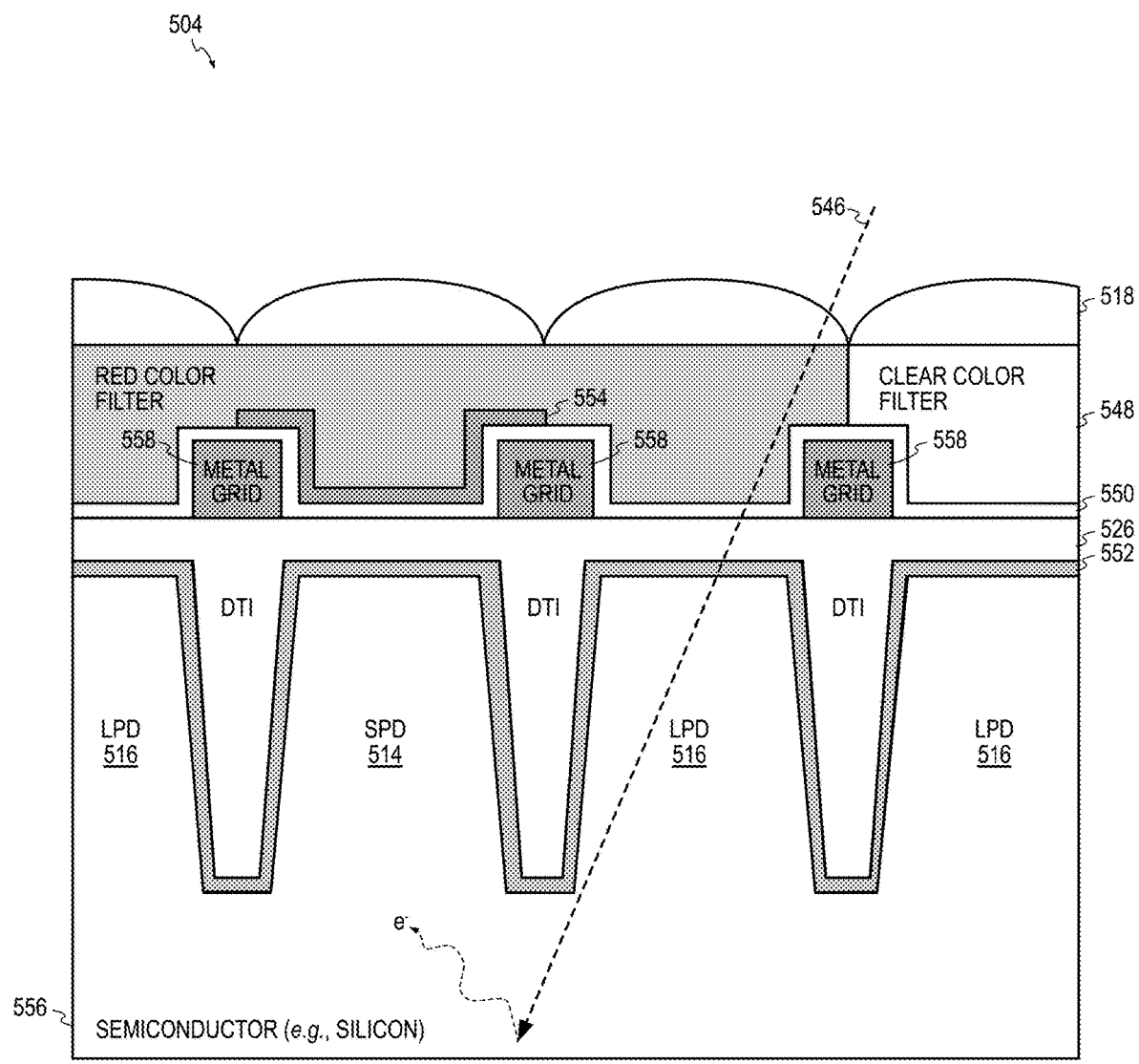
FIG. 5B illustrates one example cross-section view of a portion of the example split pixel cell of a pixel array of a high dynamic range CMOS image sensor with low color crosstalk illustrated in FIG. 5A in accordance with the teachings of the present disclosure.

FIG. 5B illustrates one example cross-section view, or side view, of a cutout of a portion of an example split pixel cell 504 of a pixel array of a high dynamic range CMOS image sensor with low color crosstalk in accordance with the teachings of the present disclosure. It is appreciated the example cross-section portion of pixel 504 of FIG. 5 may be one example of a portion of pixel cell 404 of FIG. 4 or of pixel cell 304 of FIG. 3 or of one of the pixel cells 204 of FIG. 2 or of one of the pixel cells 104 of the pixel array 102 as shown in FIG. 1, and that similarly named and numbered elements described above are coupled and function similarly below. It is appreciated that the cross-section view of the portion of pixel cell 504 of FIG. 5B may correspond to a cutout view along dashed line A-A' 528 of FIG. 5A.

As shown in the example depicted in FIG. 5B, pixel cell 504 includes large subpixel photodiodes LPD 516 and a small subpixel photodiode SPD 514 disposed in a semiconductor material 556 to photogenerate image charge in response to incident light 546. In the example, the LPD 516 subpixels are outer subpixels and the SPD 514 subpixel is an inner subpixel of pixel cell 504, wherein LPD 516 subpixels laterally surrounds the SPD 514 subpixel as described above. In one example, the semiconductor material 556 may include silicon, or other suitable type of semiconductor material. As shown in the illustrated example, a ray of stray incident light 546 is illustrated as being directed through one of the microlenses 518 and a red color filter of color filter array 548 into an LPD 516 through a backside of semiconductor material 556 and photogenerating an electron $e^-$ as crosstalk in the neighboring SPD 514. However, since SPD 514 and LPD 516 are under the same color filter (e.g., red "R" in the example shown in FIG. 5B), the crosstalk is from the same (red) color, which therefore has no impact on color reconstruction.

The example depicted in FIG. 5B also illustrates DTI structures formed with a DTI layer 526 between the SPD 514 and the LPD 516 subpixels in semiconductor material 556 to provide isolation between the SPD 514 and the LPD 516 subpixels. In the example, a metal grid 558 is formed over and vertically aligned with the DTI structures between each of the SPD 514 and LPD 516 subpixels. In the example, DTI layer 526 is insulated from semiconductor material 556 with a high-k dielectric layer 552. In addition, an insulating layer 550 is formed over metal grid 558 and DTI layer 526 as shown. In the example, the color filter array 548 is formed over the insulating layer 550. As shown, the same color filter (e.g., red in the example of FIG. 5) is disposed over the SPD 514 and LPD 516 subpixels of the same pixel cell 504. In the example, an attenuating layer 554 (e.g., neutral density filter) is disposed over the SPD 514 subpixel between the color filter array 548 and the insulating layer 550 as shown. The attenuating layer 554 may be formed of titanium (Ti), titanium nitride (TiN) or the combination thereof. High-k dielectric layer 552 may be formed of high k oxide material such as aluminum oxide ($Al_2O_3$), hafnium oxide ($HfO_2$), tantalum oxide ($Ta_2O_5$), titanium oxide ($TiO_2$), zirconium oxide ($ZrO_2$), or the combination thereof. The example depicted in FIG. 5B also illustrates that pixel cell 504 includes a plurality of microlenses 518 disposed over the color filter array 548 as shown.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, comprising:
a plurality of subpixels, wherein each one of the plurality of subpixels includes a photodiode disposed in a semiconductor material to generate image charge in response to incident light, wherein the plurality of subpixels further includes an inner subpixel laterally surrounded by a plurality of outer subpixels in the semiconductor material, wherein the plurality of outer subpixels is separated into a first grouping of outer subpixels and a second grouping of outer subpixels;
a first plurality of transfer gates disposed proximate to the inner subpixel and the first grouping of outer subpixels;
a first floating diffusion disposed in the semiconductor material and coupled to receive the image charge from each one of the first grouping of outer subpixels through the first plurality of transfer gates;
a second plurality of transfer gates disposed proximate to the inner subpixel and the second grouping of outer subpixels; and
a second floating diffusion disposed in the semiconductor material and coupled to receive the image charge from each one of the second grouping of outer subpixels through the second plurality of transfer gates,
wherein the image charge in the inner subpixel is coupled to be transferred to one of the first floating diffusion, the second floating diffusion, or both the first floating diffusion and the second floating diffusion through a respective one of the first plurality of transfer gates, one of the second plurality of transfer gates, or both said one of the first plurality of transfer gates and said one of the second plurality of transfer gates.

2. The pixel cell of claim 1, further comprising a color filter array disposed over the plurality of subpixels, wherein each one of the plurality of subpixels of the pixel cell is optically coupled to receive the incident light through a same color filter of the color filter array.

3. The pixel cell of claim 1, further comprising an attenuation layer disposed over the inner subpixel, wherein the inner subpixel is optically coupled to receive the incident light through the attenuation layer, and wherein each one of the plurality of outer subpixels is optically coupled to receive the incident light without passing through the attenuation layer.

4. The pixel cell of claim 1, further comprising a plurality of microlenses disposed over the plurality of subpixels, wherein the plurality of microlenses includes an inner microlens disposed over the inner subpixel, wherein the plurality of microlenses further includes a plurality of outer microlenses disposed over the plurality of outer subpixels.

5. The pixel cell of claim 4, wherein the plurality of subpixels is optically coupled to receive the incident light through the plurality of microlenses.

6. The pixel cell of claim 4, wherein a number of the plurality of outer microlenses is greater than a number of the plurality of outer subpixels.

7. The pixel cell of claim 6, the number of the plurality of outer microlenses is equal to 8, and wherein the number of the plurality of outer subpixels is equal to 6.

8. The pixel cell of claim 1, further comprising a deep trench isolation (DTI) structure disposed in the semiconductor material and surrounding the inner subpixel to separate the inner subpixel from the plurality of outer subpixels in the semiconductor material.

9. The pixel cell of claim 1, further comprising a deep trench isolation (DTI) structure disposed in the semiconductor material and surrounding the pixel cell, wherein the DTI structure is configured to separate the pixel cell from other pixel cells in the semiconductor material.

10. The pixel cell of claim 1, further comprising a P-well disposed in the semiconductor material separating the first grouping of outer subpixels and the second grouping of outer subpixels.

11. The pixel cell of claim 1, further comprising:
a source follower transistor coupled to a voltage supply and having a gate coupled to the first floating diffusion and coupled to the second floating diffusion to generate image data in response to the image charge in the first diffusion and the second floating diffusion;
a row select transistor coupled between the source follower transistor and a bitline; and
a reset transistor coupled between the voltage supply and the gate of the source follower transistor.

12. The pixel cell of claim 11, wherein the inner subpixel is configured as a small photodiode, wherein the source follower transistor is coupled to generate the image data in response to the image charge from only the inner subpixel to generate image data from the small photodiode.

13. The pixel cell of claim 11, wherein the plurality of outer subpixels are configured as a large photodiode, wherein the source follower transistor is coupled to generate the image data in response to the image charge from all of the plurality of outer subpixels to generate image data from the large photodiode.

14. The pixel cell of claim 11, further comprising:
a dual floating diffusion transistor coupled between the reset transistor and the gate of the source follower transistor; and
a first capacitor coupled to the dual floating diffusion transistor.

15. The pixel cell of claim 14, further comprising a second capacitor coupled the gate of the source follower transistor.

16. The pixel cell of claim 1, wherein when the image charge in the inner subpixel is coupled to be transferred to the first floating diffusion through said one of the first plurality of transfer gates, said one of the second plurality of transfer gates is biased to operate in an off state.

17. The pixel cell of claim 1, wherein when the image charge in the inner subpixel is coupled to be transferred to the second floating diffusion through said one of the second plurality of transfer gates, said one of the first plurality of transfer gates is biased to operate in an off state.

18. The pixel cell of claim 1, wherein said one of the first plurality of transfer gates is coupled to said one of the second plurality of transfer gates such that both said one of the first plurality of transfer gates and said one of the second plurality of transfer gates are coupled to transfer the image charge in the inner subpixel to both the first floating diffusion and the second floating diffusion.

19. An imaging system, comprising:
a pixel array including a plurality of pixel cells arranged into rows and columns, wherein each one of the plurality of pixel cells comprises:
a plurality of subpixels, wherein each one of the plurality of subpixels includes a photodiode disposed in a semiconductor material to generate image charge in response to incident light, wherein the plurality of subpixels further includes an inner subpixel laterally surrounded by a plurality of outer subpixels in the semiconductor material, wherein the plurality of outer subpixels is separated into a first grouping of outer subpixels and a second grouping of outer subpixels;

a first plurality of transfer gates disposed proximate to the inner subpixel and the first grouping of outer subpixels;

a first floating diffusion disposed in the semiconductor material and coupled to receive the image charge from each one of the first grouping of outer subpixels through the first plurality of transfer gates;

a second plurality of transfer gates disposed proximate to the inner subpixel and the second grouping of outer subpixels; and a second floating diffusion disposed in the semiconductor material and coupled to receive the image charge from each one of the second grouping of outer subpixels through the second plurality of transfer gates, wherein the image charge in the inner subpixel is coupled to be transferred to one of the first floating diffusion, the second floating diffusion, or both the first floating diffusion and the second floating diffusion through a respective one of the first plurality of transfer gates, one of the second plurality of transfer gates, or both said one of the first plurality of transfer gates and said one of the second plurality of transfer gates;

a control circuitry coupled to the pixel array to control operation of the pixel array; and a readout circuitry coupled to the pixel array through a plurality of bitlines to readout image data from the pixel array.

20. The imaging system of claim 19, further comprising function logic coupled to the readout circuitry to store the image data read out from the pixel array.

21. The imaging system of claim 19, further comprising a color filter array disposed over the pixel array, wherein each one of the plurality of pixel cells is disposed beneath a color filter of the color filter array such that each one of the plurality of subpixels of each one of the plurality of pixel cells is optically coupled to receive the incident light through a same color filter of the color filter array.

22. The imaging system of claim 19, wherein each one of the plurality of pixel cells further comprises an attenuation layer disposed over the inner subpixel, wherein the inner subpixel is optically coupled to receive the incident light through the attenuation layer, and wherein each one of the plurality of outer subpixels is optically coupled to receive the incident light without passing through the attenuation layer.

23. The imaging system of claim 19, wherein each one of the plurality of pixel cells further comprises a plurality of microlenses disposed over the plurality of subpixels, wherein the plurality of microlenses includes an inner microlens disposed over the inner subpixel, wherein the plurality of microlenses further includes a plurality of outer microlenses disposed over the plurality of outer subpixels.

24. The imaging system of claim 23, wherein the plurality of subpixels is optically coupled to receive the incident light through the plurality of microlenses.

25. The imaging system of claim 23, wherein a number of the plurality of outer microlenses is greater than a number of the plurality of outer subpixels.

26. The imaging system of claim 25, the number of the plurality of outer microlenses is equal to 8, and wherein the number of the plurality of outer subpixels is equal to 6.

27. The imaging system of 19, wherein each one of the plurality of pixel cells further comprises a deep trench isolation (DTI) structure disposed in the semiconductor material and surrounding the pixel cell, wherein the DTI structure is configured to separate the pixel cell in the semiconductor material from other pixel cells in the pixel array.

28. The imaging system claim 19, wherein each one of the plurality of pixel cells further comprises a P-well disposed in the semiconductor material separating the first grouping of outer subpixels and the second grouping of outer subpixels.

29. The imaging system of claim 28, wherein each one of the plurality of pixel cells further comprises a deep trench isolation (DTI) structure disposed in the semiconductor material and surrounding the inner subpixel to separate the inner subpixel from the plurality of outer subpixels in the semiconductor material.

30. The imaging system of claim 19, wherein each one of the plurality of pixel cells further comprises:

a source follower transistor coupled to a voltage supply and having a gate coupled to the first floating diffusion and coupled to the second floating diffusion to generate image data in response to the image charge in the first diffusion and the second floating diffusion;

a row select transistor coupled between the source follower transistor and a bitline; and a reset transistor coupled between the voltage supply and the gate of the source follower transistor.

31. The imaging system of claim 30, wherein the inner subpixel is configured as a small photodiode, wherein the source follower transistor is coupled to generate the image data in response to the image charge from only the inner subpixel to generate image data from the small photodiode.

32. The imaging system of claim 30, wherein the plurality of outer subpixels are configured as a large photodiode, wherein the source follower transistor is coupled to generate the image data in response to the image charge from all of the plurality of outer subpixels to generate image data from the large photodiode.

33. The imaging system of claim 30, wherein each one of the plurality of pixel cells further comprises:

a dual floating diffusion transistor coupled between the reset transistor and the gate of the source follower transistor; and a first capacitor coupled to the dual floating diffusion transistor.

34. The imaging system of claim 33, wherein each one of the plurality of pixel cells further comprises a second capacitor coupled the gate of the source follower transistor.

35. The imaging system of claim 19, wherein each one of the plurality of pixel cells has a mirror symmetry with respect to a diagonal axis of each respective pixel cell.

36. The imaging system of claim 19, wherein when the image charge in the inner subpixel is coupled to be transferred to the first floating diffusion through said one of the first plurality of transfer gates, said one of the second plurality of transfer gates is biased to operate in an off state.

37. The imaging system of claim 19, wherein when the image charge in the inner subpixel is coupled to be transferred to the second floating diffusion through said one of the second plurality of transfer gates, said one of the first plurality of transfer gates is biased to operate in an off state.

38. The imaging system of claim 19, wherein said one of the first plurality of transfer gates is coupled to said one of the second plurality of transfer gates such that both said one of the first plurality of transfer gates and said one of the second plurality of transfer gates are coupled to transfer the image charge in the inner subpixel to both the first floating diffusion and the second floating diffusion.

* * * * *